United States Patent
Numata et al.

[11] Patent Number: 5,133,989
[45] Date of Patent: Jul. 28, 1992

[54] PROCESS FOR PRODUCING METAL-POLYIMIDE COMPOSITE ARTICLE

[75] Inventors: Shunichi Numata, Hitachi; Takao Miwa, Katsuta; Takayoshi Ikeda, Ibaraki; Koji Fujisaki, Hitachi; Hisae Shimanoki, Hitachi; Kunio Miyazaki, Hitachi; Osamu Miura, Hitachi; Ryuji Watanabe, Ibaraki; Toshio Miyamoto, Takasaki; Yukio Okoshi, Mito, all of Japan

[73] Assignee: Hitachi, Ltd., Tokyo, Japan

[21] Appl. No.: 416,279

[22] Filed: Sep. 27, 1989

[30] Foreign Application Priority Data

Sep. 30, 1988 [JP] Japan .............................. 63-243986

[51] Int. Cl.⁵ ............................................ C23C 26/00
[52] U.S. Cl. .................................... 427/96; 427/123; 427/125; 428/458
[58] Field of Search .................. 427/96, 123, 125; 106/802; 428/458

[56] References Cited

U.S. PATENT DOCUMENTS

| | | | |
|---|---|---|---|
| 4,338,427 | 7/1982 | Maekawa et al. | 528/53 |
| 4,347,306 | 8/1982 | Takeda | 427/265 |
| 4,562,142 | 12/1985 | Kakumaru | 430/288 |
| 4,654,223 | 3/1987 | Araps | 427/96 |
| 4,656,050 | 4/1987 | Araps | 427/96 |
| 4,699,803 | 10/1987 | Araps | 427/96 |
| 4,731,287 | 3/1988 | Noda | 427/96 |
| 4,758,476 | 7/1988 | Sekine | 428/473.5 |
| 4,792,476 | 12/1988 | Numata | 428/458 |
| 4,910,293 | 3/1990 | Uekita | 427/402 |
| 4,943,471 | 7/1990 | Uekita | 428/411.1 |

FOREIGN PATENT DOCUMENTS

| | | |
|---|---|---|
| 0143531 | 4/1985 | European Pat. Off. |
| 0130417 | 3/1987 | European Pat. Off. |
| 2473358 | 12/1987 | European Pat. Off. |
| 251828 | 1/1988 | European Pat. Off. |
| 1076722 | 1/1970 | United Kingdom |

OTHER PUBLICATIONS

Patent Abstracts of Japan, vol. 8, No. 93.
Patent Abstracts of Japan, vol. 12, No. 70.
Patent Abstracts of Japan, vol. 12, No. 242.

*Primary Examiner*—Michael Lusignan
*Assistant Examiner*—Vi Duong Dang
*Attorney, Agent, or Firm*—Antonelli, Terry, Stout & Kraus

[57] ABSTRACT

The present invention provides a process for producing a metal-polyimide composite material such as a wiring board. In production thereof, deterioration of polyamide film due to oxidation during imidization of a polyimide precursor in contact with metal such as copper or silver can be prevented. The present invention is characterized by using a polyimide precursor having an acidic functional group which is masked. Examples of the polyamide precursor are polyamic acid epoxy adducts, amido polyamic acids, silylated polyamic acids, etc.

16 Claims, 1 Drawing Sheet

PROCESS FOR PRODUCING METAL-POLYIMIDE COMPOSITE ARTICLE

BACKGROUND OF THE INVENTION

The present invention relates to a process for producing a metal-polyimide composite article and more particularly to a wiring board which exhibits a very small in delay time. The composite article of the present invention employs a polyimide which is low in dielectric constant and high in heat resistance as an insulating film and a conductor such as copper low in resistance in a wiring layer. The invention relates to materials which can be used for main high-density and high-speed wiring boards for future computers of from large size to middle or small size and flexible printed boards which are essential for miniaturization of electronic parts.

Hitherto, there have been used multi-layer circuit boards comprising an epoxy or maleimide resin-glass cloth laminate and copper foil and an alumina/tungsten multi-layered circuit boards as high density wiring board. However, in the former case, there are limitations in production methods and materials and fine wire width of less than 30 μm cannot be obtained and in the latter case, tungsten of high heat resistance with high resistivity must be used because ceramics are high in dielectric constant and a very high temperature process is required for production. Thus, wiring boards of high performance have been demanded as future high-speed and high-density wiring boards to be used in place of the above conventional wiring boards. The first one is a copper/polyimide wiring board. This is produced by forming polyimide of low dielectric constant and copper of low resistivity on a silicon wafer or ceramic substrate by the same fine process as used for production of semiconductor wiring. By this method, it can be expected that wiring board of high performance is obtained.

However, there is the problem that when polyamic acid which is a polyimide precursor is heated and cured in contact with copper or silver at higher than 300° C., a pyrolysis reaction occurs which cannot be considered to occur in view of the heat resistance of polyimide per se. For example, it has been known that when polyamic acid varnish is coated on a film of copper and heat cured, distinct discoloration is recognized at higher than 300° C. and the film becomes mechanically very brittle. Similar phenomena are recognized to occur at production of flexible printed board or curing of electrically conductive silver paste. In case of metals, this problem is especially conspicuous for copper and silver and nearly no problem is seen in aluminum, titanium, nickel and chromium.

Up to now, in forming an imidized film in contact with a metal, the following methods have been employed, namely, a method of forming a metallic film such as of inert chromium or an inert film of $SiO_2$ or $Si_3N_4$ and coating thereon a polyamic acid precursor varnish and heating and curing the varnish and a method of heating and curing the varnish in a reducing atmosphere such as hydrogen when the varnish is allowed to directly contact with the metal. These methods suffer from severe problems such as much increase in the number of steps and increase in running cost.

Taking the hint from the fact that even if a film of such metal is formed on a polyimide film and heated, substantially no adverse effect is given to the polyimide film, the inventors coated a varnish of a polyamic acid on a metallic film and heated and cured the varnish and as a result have found that no deterioration of polyimide occurs. However, this method still has the problems that since solubility of polyimide is very poor, cresol type solvents which are harmful to human bodies must be used and only special solvents which are highly soluble in polyimide per se can be used.

As a result of investigation for solving these problems, it has been found that when polyamic acid of which carboxylic acid is esterified by an alcohol is used, no problem occurs. However, since this polyamic acid whose carboxylic acid is esterified is obtained by reacting an acid anhydride with an alcohol, then converting the product to an acid chloride with thionyl chloride and then further reacting the acid chloride with a diamine, there are many problems to be solved that preparation steps are much prolonged and ionic impurities are incorporated at preparation steps to cause troubles in use.

SUMMARY OF THE INVENTION

The object of the present invention is to provide a metal/polyimide composite molded article of high reliability which is prevented from heat deterioration of polyimide film which may occur when conventional polyamic acid is coated on a metallic film and cured with heat and which is prevented from deterioration even when it is produced in an atmosphere which is not a special one such as reducing atmosphere.

The inventors have carefully studied chemical reaction of polyimide precursor and metal which takes place in production of a metal/polyimide composite which includes thermal imidization in contact of polyimide precursor with metal. As a result, it has been elucidated that metal is dissolved in the presence of carboxylic acid of polyamic acid and subsequently when it is exposed to high temperature, imide ring is decomposed by the metal and simultaneously particulate metal oxide is precipitated. Furthermore, it has also been found that similar phenomenon is also recognized for polyimide precursor having sulfonic acid group and presence of acidic functional group causes dissolution of metal. The present invention has been accomplished based on this finding.

DESCRIPTION OF THE INVENTION

Figure 1:
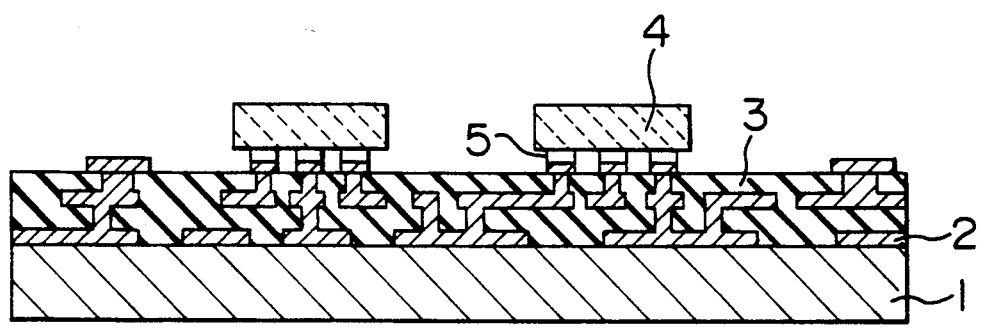
FIG. 1 is a schematical cross-sectional view illustrating a high-density wiring board which is one specific example of the present invention.

That is, the present invention is concerned with a process for producing a metal/polyimide composite article produced by a method including the step of imidization of a polyimide precursor in contact with a metal, characterized in that acidic functional group such as carboxyl group, sulfonic group, or the like in the polyimide precursor is masked.

According to the present invention, there is provided a process for producing a metal/polyimide composite article comprising:
providing a precursor of a polyimide in contact with an electroconductive solid metal material; and heating the precursor until it turns into the polyimide, wherein the precursor in a member selected from the group consisting of a polyamic acid epoxy adduct, an amino polyamic acid, a silylated polyamic acid, and a reaction product of a diisocyanate organic compound and a tetracarboxylic acid dianhydride. In another aspect of the present invention, there is provided a process for producing a printed circuit board comprising:

forming a copper film on an electrically insulating substrate;

coating a precursor of a polyimide on said copper film; and heating the precursor until it turns into the polyimide, wherein the precursor is a member selected from the group consisting of a polyamic acid epoxy adduct, an amino polyamic acid, a silylated polyamic acid, and a reaction product of a diisocyanate organic compound and a tetracarboxylic acid dianhydride. In a further aspect of the present invention, there is provided a process for producing a metal/polyimide composition comprising:

providing a homogeneous mixture of a precursor of polyimide, powder of an electroconductive solid metallic material and an organic solvent for dissolving the precursor; and heating the precursor until it turns into the polyimide, wherein the precursor is a member selected from the group consisting of a polyamic acid epoxy adduct, an amino polyamic acid, a silylated polyamic acid, and a reaction product of a diisocyanate organic compound and a tetracarboxylic acid dianhydride. In a still further aspect of the present invention, there is provided a process for producing a multi-layered printed circuit board, which comprises the steps of:

a first step for forming a circuit pattern of copper film on an electrically insulating substrate;

a second step for coating varnish of a precursor of a polyimide on said pattern;

a third step for heating the varnish until the precursor turns into the polyimide;

a fourth step for patterning the polyimide to form through-holes therein; and a fifth step for forming a circuit pattern of copper on said patterned polyimide;

said second step through said fifth step being repeated until a desired number of layers is obtained, wherein the precursor is a member selected from the group consisting of a polyamic acid epoxy adduct, an amino polyamic acid, a silylated polyamic acid, and a reaction product of a diisocyanate organic compound and a tetracarboxylic acid dianhydride.

The polyimide precursors used in the present invention include, for example, the following.

Polyamic acid epoxy adduct (I) or (II) having the following chemical structure which is obtained, for example, by reacting a polyamic acid with a compound having at least one epoxy group.

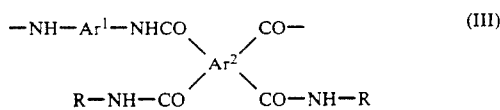

Amido polyamic acid (III) or (IV) which is a reaction product of, for example, an isocyanate compound with a polyamic acid.

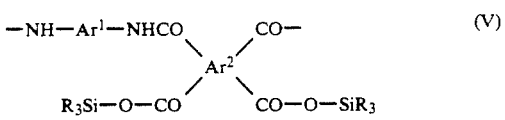

Silylated polyamic acid (V) or (VI) which is obtained, for example, by reaction of silylated diamine with an acid dianhydride.

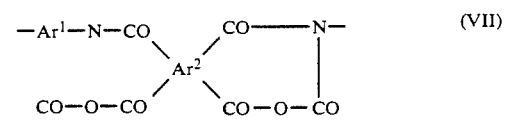

A product (VII) obtained by reaction of a diisocyanate compound with an acid dianhydride.

$$-Ar^1-N-CO\diagdown_{Ar^2}\diagup CO-\!\!\!-\!\!\!-N- \quad (VII)$$
$$CO-O-CO \diagup \quad \diagdown CO-O-CO$$

In the above formulae, $Ar^1$ represents a residue of a diamine compound, $Ar^2$ represents a residue of a tetracarboxylic acid and R each represents a residue of an organic compound.

Of these marked polyamic acids which are precursors for polyimide: (I) and (II) have the features that reactivity is superior and adverse impurities are not produced by condensation reaction and has the problem that relatively large condensation product volatilizes at imidization and hence curing shrinkage is somewhat high; (III) and (IV) have the problem that since it includes reaction with isocyanate compound, polyamic acid reacts even at a low temperature, but if unreacted functional group remains, carbon dioxide is generated to cause bubbling; (V) and (VI) have the features that it is relatively easy to prepare and various monomers can be used since reactivity in preparation of polyamic acid is strong and further, it tends to decrease in varnish viscosity owing to reduction of polarity; and (VII) is easy to prepare, but has the problem in stability because with progress of reaction, imidization occurs with generation of carbon dioxide. As explained above, the polyimide precursors have respective characteristics depending on difference in masking method and they are used properly depending on the use.

Of the above polyimide precursors, (I) to (IV) can be obtained by reacting a polyamic acid obtained by homopolymerization of an aminodicarboxylic acid derivative or reaction of a diamine with a tetracarboxylic acid derivative with an epoxy compound or an isocyanate compound. The tetracarboxylic acid derivative includes acid anhydrides and acid chlorides. The acid anhydrides are preferred for preparation.

The reaction for preparation of polyamic acids is generally carried out at −20–200° C. in solvents such as N-methylpyrrolidone (NMP), dimethylformamide (DMF), dimethylacetamide (DMAC), dimethylsulfoxide (DMSO), dimethyl sulfate, sulforan, butyl lactone, cresol, phenol, halogenated phenol, cyclohexanone, dioxane, tetrahydrofuran, and acetophenone.

As examples of the aminodicarboxylic acid derivatives used in the present invention, mention may be made of 4-aminophthalic acid, 4-amino-5-methylphthalic acid, 4-(p-anilino)-phthalic acid, 4-(3,5-dimethyl-4-anilino)phthalic acid and acid anhydrides and acid chlorides thereof.

The diamines used in the present invention include, for example, aromatic diamines such as p-phenylenediamine (p-PDA), 2,5-diaminotoluene, 2,5-diaminoxylene, diaminodurene(2,3,5,6-tetramethylphenylenediamine), 2,5-diaminobenzotrifluoride, 2,5-diaminoanisole, 2,5-diaminoacetophenone, 2,5-diaminobenzophenone, 2,5-diaminodiphenyl, 2,5-diaminofluorcbenzene, benzidine, o-tolidine (o-TLD), m-tolidine, 3,3',5,5'-tetramethylbenzidine, 3,3'-dimethoxybenzidine, 3,3'-di(trifluoromethyl)benzidine, 3,3'-diacetylbenzidine, 3,3'-difluorobenzidine, octafluorobenzidine, 4,4''-diaminoterphenyl (DATP), and 4,4'''-diaminoquaterphenyl which have linear conformations, and m-phenylenediamine, 4,4'-diaminodiphenylmethane, 1,2-bis(anilino)ethane, 4,4'-diaminodiphenyl ether (DDE), diaminodiphenylsulfone, 2,2-bis(p-aminophenyl)propane, 2,2-bis(p-aminophenyl)-hexafluoropropane, 3,3'-dimethyl-4,4'-diaminodiphenyl ether, 3,3'-dimethyl-4,4'-diaminodiphenylmethane, diaminotoluene, diaminobenzotrifluoride, 1,4-bis(p-aminophenoxy)benzene, 4,4'-bis(p-aminophenoxy)biphenyl, 2,2-bis{4-(p-aminophenoxy)phenyl} propane, 2,2-bis{4-(m-aminophenoxy)phenyl} propane, 2,2-bis{4-(p-aminophenoxy)phenyl} hexafluoropropane, 2,2-bis{4-(m-aminophenoxy)phenyl} hexafluoropropane, 2,2-bis{4-(p-aminophenoxy)-3,5-dimethylphenyl}-hexafluoropropane, 2,2-bis{4-(p-aminophenoxy)-3,5-ditrifluoromethylphenyl}-hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis(3-amino-5-trifluoromethylphenoxy)diphenylsulfone, 2,2'-bis{4-(p-amino-3-trifluoromethylphenoxy)-phenyl} hexafluoropropane, diaminoanthraquinone, 4,4-bis(3-aminophenoxyphenyl)diphenylsulfone, 1,3-bis(anilino)hexafluoropropane, 1,4-bis(anilino)-octafluorobutane, 1,5-bis(anilino)-decafluoropentane and 1,7-bis(anilino)tetradecafluoroheptane. Moreover, diaminosiloxanes represented by the formula:

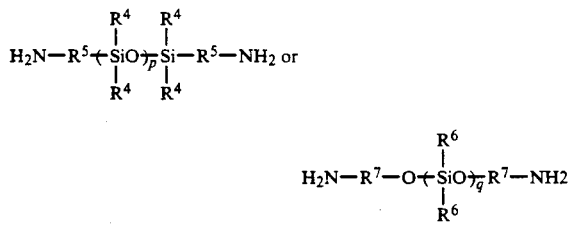

wherein $R^5$ and $R^7$ each represents a divalent organic group, $R^4$ and $R^6$ each represents a monovalent organic group and p and q each denotes an integer of more than 1, may also be used as diamines.

The following tetracarboxylic acids and their derivatives can be used in the present invention: pyromellitic acid (PMDA), methylpyromellitic acid, dimethylpyromellitic acid, di(trifluoromethyl)pyromellitic acid, 3,3',4,4'-biphenyltetracarboxylic acid (s-BPDA), 5,5'-dimethyl-3,3',4,4'-biphenyltetracarboxylic acid, p-(3,4-dicarboxyphenyl)benzene, 2,3,3',4'-tetracarboxydiphenyl, 3,3',4,4'-tetracarboxydiphenyl ether, 2,3,3',4'-tetracarboxydiphenyl ether, 3,3',4,4'-tetracarboxybenzophenone (BTDA), 2,3,',4'-tetracarboxybenzophenone, 2,3,6,7-tetracarboxynaphthalene, 1,4,5,7-tetracarboxynaphthalene, 1,2,5,6-tetracarboxynaphthalene, 3,3',4,4'-tetracarboxydiphenylmethane, 2,3,3',4'-tetracarboxydiphenylmethane, 2,3-bis(3,4-dicarboxyphenyl)propane, 2,2-bis(3,4-dicarboxyphenyl)hexafluoropropane, 3,3',4,4'-tetracarboxydiphenylsulfone, 3,4,9,10-tetracarboxyperillene, 2,2-bis{4-(3,4-dicarboxyphenoxy)phenyl} propane, 2,2-bis{4-(3,4-dicarboxyphenoxy)phenyl} hexafluoropropane, butanetetracarboxylic acid, and cyclopentantetracarboxylic acid. Acid anhydrides and acid chlorides may also be used.

The polyamic acid epoxy adducts (I) and (II) can be obtained, for example, by reacting the thus obtained polyamic acid with a compound having at least one epoxy group. This has the merit that polyimide precursor of high molecular weight can be prepared very easily by reaction of polyamic acid with epoxy resins, compared with preparation of conventional polyamic acids by polycondensation of esterified tetracarboxylic acids and diamine using a dehydrating agent or by once converting polyamic acid to an acid chloride and then reacting it with an alcohol. The reaction of polyamic acid with epoxy compound can be carried out only by heating them at higher than 60° C., but in order to carry out the reaction at as low a temperature as possible without allowing imidization reaction to take place, it is preferred to use a curing accelerator for epoxy resin such as a tertiary amine, an imidazole, or triphenylphosphine as a catalyst.

The amido polyamic acids (III) and (IV) can be obtained, for example, by reacting the polyamic acid with a compound having at least one isocyanate group. This is also easily obtained by reacting the polyamic acid with the isocyanate compound at from room temperature to about 100° C.

The silylated polyamic acid (V) and (VI) can be very easily prepared, for example, by the reaction of an alkylsilylated diamine with a tetracarboxylic acid dianhydride or by the reaction of polyamic acid with an alkyldisilazane under conditions where substantially no impurities are incorporated.

The polyimide precursor (VII) which is a reaction product of an organic diisocyanate and a tetracarboxylic acid dianhydride also has no acidic functional group and so metal is hardly dissolved and incorporated therein and thus this has substantially no problem of deterioration of polyimide film at high temperatures.

Other merits of the present invention are that varnish is low in viscosity and superior in stability.

The polyimide precursor film can be formed by generally employed spin coat method and the like. In formation of the film, it is preferred to imidize the coat by drying it at 50–250° C. and then heating to about 250–400° C.

In the present invention adhesion of polyimide to various substrates is important. It is preferred to roughen the surface of inorganic materials or to treat the surface with a silane coupling agent, titanate coupling agent, aluminum alcoholate, aluminum chelate, zirconium chelate, aluminum acetylacetonate, or the like. These surface treating agents may be added to polyimide for its precursor. Alternatively, diamine or tetracarboxylic acid dianhydride having a siloxane skeleton may be copolymerized therewith.

In the present invention, when the polyimide skeleton has a linear conformation, thermal expansion coefficient of the film is very small and modulus thereof increases, but it is also possible to decrease heat expansion coefficient, increase modulus and control fluidity by incorporating therein powder, fiber, chopped strand or the like of inorganic materials, organic materials or metals.

Further, the polyimide precursor of the present invention in which an acidic functional group such as carboxyl group or sulfone group is masked can be used as a conductive coating composition by adding thereto powder of metallic materials such as a metallic powder of copper or silver.

Figure 2:
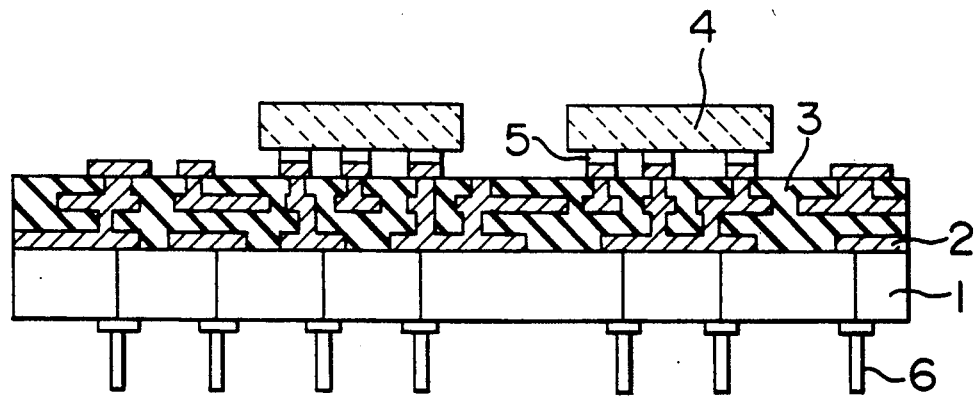
FIG. 2 is a schematical cross-sectional view illustrating an example of application of the present invention to a package substrate for multi-chip module.

The present invention is applied to production of multi-chip modulus shown in FIGS. 1 and 2. A pattern 2 of copper film is formed on an insulating substrate or circuit board 1 by vacuum evaporation. Patterning of the copper film is performed by chemical etching or dry etching which are well known in the art.

A varnish of a precursor (i.e. a polyamic acid ester) of a polyimide is coated on the patterned copper film 2; then the coating of the precursor is dried and heated to effect imidization of the precursor. The polyimide film is then patterned to form one or more through-holes by etching with hydrazine or by dry etching by means of an ion milling apparatus. Another copper film is deposited on the patterned polyimide film so that the lower copper film and upper copper film are electrically connected. Then, the upper copper film is patterned thereby to form desired circuits. After the desired number of layers of copper film and polyimide film is formed, semiconductor chips 4 are bonded to the patterned copper film through (controlled collapse bonding (CCB) 5.

FIG. 2 shows an LSI package of ceramic pin grid array type in which the multi-layered circuit board comprising 2 and 3 is produced by the same manner as in FIG. 1. Numeral 6 represents pins.

The following nonlimiting examples explain the present invention specifically.

EXAMPLE 1 p-PDA was reacted with s-BPDA by conventional method to obtain a 15% solution of polyamic acid in N-methyl-2-pyrrolidone (abbreviated to "NMP" hereinafter). To this solution was added an equivalent amount of phenylglycidyl ether and reaction was allowed to proceed in the presence of benzyldimethylamine at 80° C. for 5 hours to obtain a hydroxy esterified polyamic acid. Addition amount of benzyldimethylamine was 2% by weight of phenylglycidyl ether.

This polyamic acid epoxy adduct varnish was spin coated on the surface of a silicon wafer having a copper thin film vapor deposited thereon to form a film of 15 μm thick. Heating conditions for imidization were heating at 100° C. for 30 minutes, heating from 100°C. to 400° C. over 1 hour and keeping at that temperature for 30 minutes. The heating atmosphere was air. This polyimide film was peeled from silicon wafer and copper content in this film, color, heat decomposition temperature and tensile strength were measured to find that this film contained only 0.02% (atomic-absorption method) of copper, color of the film was brown and this was nearly the same as the film formed on inert $SiO_2$ film (Comparative Example 1), decomposition temperature in air was 505° C. and tensile strength was 400 MPa and elongation was 20%, namely, this film had conspicuously excellent heat resistance and mechanical properties.

Furthermore, the film was dipped in an etching solution for copper for about 5 hours and then heat decomposition temperature and mechanical properties were measured to find that the values were nearly the same as those of the film which was not dipped in the etching solution and thus the film was chemically very stable.

COMPARATIVE EXAMPLE 1

A 15% NMP solution of polyamic acid obtained from p-PDA and s-BPDA was spin coated on the surface of a silicon wafer having silicon oxide film to form a film of 15 μm thick. Conditions for imidization with heating were the same as in Example 1. The polyimide film was peeled from silicon wafer and color, heat decomposition temperature and tensile strength were measured. This film had brown color, a decomposition temperature in air of 510° C., a tensile strength of 350 MPa and an elongation of 25%, namely, had very excellent heat resistance and mechanical properties. It can be seen that the polyimide film of Example 1 had characteristics similar to those of this film formed on an inert surface such as the thermally oxidized film. Content of copper in this film was naturally very low, namely, less than 0.0003%.

Furthermore, this film was dipped in an etching solution for copper for about 5 hours and then heat decomposition temperature and mechanical properties of this film were measured to find that this film had nearly the same values as those of the film which was not dipped in the etching solution and was chemically very stable as in Example 1.

COMPARATIVE EXAMPLE 2

In the same manner as in Example 1, a copper thin film was vapor deposited on a silicon wafer, a pattern was formed by etching, and thereon was coated the same polyamic acid varnish as used in Comparative Example 1 and imidized with heating under the same conditions as in Example 1. As a result, discoloration of the polyimide film on the copper pattern to blackish brown occurred and when the film was peeled, it was torn off from the discolored portion of the copper pattern. Separately, copper was vapor deposited on a silicon wafer as above and then, thereon polyamic acid varnish was coated without forming pattern and was imidized by heating. Thereafter, this was dipped in an etching solution for copper and the film was peeled therefrom. Content of copper in this film was very high, namely, 0.3%. This film had a heat decomposition starting temperature of 330° C. and thus was inferior in heat resistance by nearly 200° C. to the film formed on an inert film and besides film strength and elongation were much deteriorated, namely, 150 MPa and 3%, respectively. These seem to be caused by dissolution of copper due to the presence of carboxylic acid in the polyamic acid which is a polyimide precursor and deterioration of imide ring due to oxidation with copper in the film.

COMPARATIVE EXAMPLE 3

In place of copper used in Comparative Example 2, silver film was formed on a silicon wafer by vapor deposition and the same polyamic acid varnish as in Comparative Example 2 was coated thereon and imidized by heating. The polyimide film peeled therefrom had a heat decomposition starting temperature of 400° C. which was better than when the film was formed on a copper film, but was inferior in heat resistance by nearly 100° C. to the film formed on an inert film and besides the film was much inferior in film strength and elongation, namely, 220 KPa and 6%, respectively. These seem to be caused by dissolution of silver due to the presence of carboxylic acid in the polyamic acid which is a polyimide precursor and deterioration of imide ring by oxidation with silver in the film.

COMPARATIVE EXAMPLE 4

In place of copper in Comparative Example 2, a nickel film was formed on a silicon wafer by vapor deposition and the same polyamic acid varnish as used in Comparative Example 2 was coated thereon and imidized by heating. Then, this was dipped in an etching solution for nickel and the film was peeled therefrom. This polyimide film had a heat decomposition temperature of 495° C. and was equal to the film formed on an inert film in heat resistance and considerably superior to the film formed on copper film. Besides, film strength and elongation were 290 MPa and 17%, respectively which caused no severe problems. Amount of nickel dissolved due to the presence of carboxylic acid in polyamic acid which is a polyimide precursor was very small. In the case of nickel, deterioration of imide ring due to oxidation is not so severe.

COMPARATIVE EXAMPLE 5

The same polyamic acid varnish as used in Comparative Example 2 was coated on copper thin film vapor deposited on a silicon wafer and imidized by heating in the same manner as in Comparative Example 2 except that atmosphere for curing by heating was not air, but a nitrogen gas containing a small amount of hydrogen, namely, slightly reducing atmosphere. As a result, no change was seen in polyimide film. Heat decomposition starting temperature of the polyimide film peeled by removing copper by etching was 500° C., namely, heat decomposition characteristic of this film was markedly higher than the film imidized by heating in air and nearly the same as the film cured on an inert film. Besides, film strength and elongation were 350 MPa and 21%, respectively and were somewhat inferior to those of the polyimide film formed on SiO2 film, but it was recognized that the film was subject to substantially no influence of copper. It seems that copper was dissolved due to the presence of carboxylic acid in polyamic acid which is a polyimide precursor, but copper in the film became inert by the heat treatment in the reducing atmosphere.

EXAMPLE 2

In the same manner as in Example 1, DDE and PMDA were reacted by conventional method to obtain a 15% solution of polyamic acid in N-methyl-2-pyrrolidone (abbreviated to "NMP" hereinafter). Further, in the same manner as in Example 1, this solution was reacted with an equivalent amount of phenylglycidyl ether in the presence of benzyldimethylamine at 80° C. for 5 hours to obtain a polyamic acid epoxy adduct. Addition amount of benzyldimethylamine was 2% by weight of phenylglycidyl ether.

This polyamic acid epoxy adduct varnish was spin coated on the surface of a silicon wafer having a copper thin film vapor deposited thereon to form a film of 15 μm thick. Heating conditions for imidization were heating at 100° C. for 30 minutes, heating from 100° C. to 400° C. over 1 hour and keeping at that temperature for 30 minutes. The heating atmosphere was air. This polyimide film was peeled from silicon wafer and copper content in this film, color, heat decomposition temperature and tensile strength were measured to find that this film contained only 0.03% (atomic-absorption method) of copper, color of the film was brown and this was nearly the same as the film formed on inert SiO2 film, decomposition temperature in air was 460° C. and tensile strength was 180 MPa and elongation was 25%, namely, this film had conspicuously excellent heat resistance and mechanical properties. These values were nearly the same as those of the film formed on SiO2 film.

EXAMPLE 3

DDE was reacted with trimethylchlorosilane in the presence of triethylamine in toluene to obtain bis(trimethylsilyl)diaminodiphenyl ether. This product was reacted with pyromellitic anhydride at room temperature in NMP to obtain 15% varnish of silylmethylated polyamic acid. Then, this silylated polyamic acid varnish was spin coated on the surface of a silicon wafer having a copper thin film vapor deposited thereon to form a film of 10 μm thick in the same manner as in Example 1. Heating conditions for imidization were the same as those in Example 1. This polyimide film was peeled from by etching copper and content of copper, color, heat decomposition temperature and tensile strength were measured. As a result, the film contained only 0.02% of copper and had brown color which was nearly the same as that of the film formed on an inert SiO2 film. Furthermore, this film had markedly excellent heat resistance and mechanical properties, namely, a decomposition temperature of 460° C. in air, a tensile strength of 170 MPa, and an elongation of 30%.

EXAMPLE 4

Silylated DATP and s-BPDA were reacted by conventional method to obtain a 15% NMP solution of silylated polyamic acid.

This silylated polyamic acid varnish was spin coated on the surface of a silicon wafer having a copper thin film vapor deposited thereon to form a film of 15 82 m thick. Heating conditions for imidization were heating at 100° C. for 30 minutes, heating from 100° C. to 400° C. over 1 hour and keeping at that temperature for 30 minutes. The heating atmosphere was air. This polyimide film was peeled from the silicon wafer and copper content in this film, color, heat decomposition temperature and tensile strength were measured. As a result, this film contained only 0.02% (atomic-absorption method) of copper, color of the film was brown which was nearly the same as that of the film formed on the inert SiO2 film. Decomposition temperature of this film in air was 510° C. and tensile strength was 420 MPa and elongation was 25%, namely, this film had remarkably excellent heat resistance and mechanical properties. Further, this film was dipped in an etching solution for copper for about 5 hours and then heat the decomposition temperature and mechanical properties of the film were measured to find that the obtained values were nearly the same as those of the film which was not dipped in the etching solution and thus the film of this example was chemically very stable.

EXAMPLE 5

Silylated p-PDA and BTDA were reacted by conventional method to obtain a 15% NMP solution of silylated polyamic acid.

This silylated polyamic acid varnish was spin coated on the surface of a silicon wafer having a copper thin film vapor deposited thereon to form a film of 15 μm thick. Heating conditions for imidization were the same as in Example 1. This polyimide film was peeled from the silicon wafer by etching the copper thin film and content of copper in the film, color, heat decomposition temperature and tensile strength of the film were measured. As a result, the film contained only 0.04% of copper and had brown color which was nearly the same as that of the film formed on an inert SiO₂ film. Furthermore, this film had markedly excellent heat resistance and mechanical properties, namely, a decomposition temperature of 470° C. in air, a tensile strength of 270 MPa, and an elongation of 22%.

EXAMPLE 6

Silylated p-PDA and s-BPDA were reacted by conventional method to obtain a 15% NMP solution of silylated polyamic acid.

This silylated polyamic acid varnish was spin coated on the surface of a silicon wafer having a silver thin film vapor deposited thereon to form a film of 15 μm thick. Heating for imidization was carried out in air in the same manner as in Example 1. This polyimide film was peeled from the silicon wafer and silver content in this film, color, heat decomposition temperature and tensile strength were measured. As a result, this film contained only 0.008% (atomic-absorption method) of silver, color of the film was brown which was nearly the same as that of the film formed on inert SiO₂ film. Decomposition temperature of this film in air was 510° C. and tensile strength was 450 MPa and elongation was 27%, namely, this film had remarkably excellent heat resistance and mechanical properties.

EXAMPLE 7 o-TLD and BTDA were reacted by conventional method to obtain a 15% NMP solution of polyamic acid. Furthermore, thereto was added phenyl isocyarate in an amount of 2 times the mol of BDTA and reaction was allowed to proceed for 5 hours at room temperature and for 2 hours at 80° C. to obtain an amido polyamic acid.

This amido polyamic acid varnish was spin coated on the surface of a silicon wafer having a copper thin film vapor deposited thereon to form a film of 10 μm thick. Heating conditions for imidization were the same as those in Example 1. This polyimide film was peeled from the silicon wafer and content of copper in the film, color, heat decomposition temperature and tensile strength were measured. As a result, the film contained only 0.01% of copper and had brown color which was nearly the same as that of the film formed on an inert SiO₂ film. Furthermore, this film had markedly excellent heat resistance and mechanical properties, namely, a decomposition temperature of 430° C. in air, a tensile strength of 370 MPa, and an elongation of 17%.

EXAMPLE 8

Diphenylmethane diisocyanate (MDI) and s-BPDA were reacted by conventional method to obtain a 15% NMP solution of a polyimide precursor.

This varnish was spin coated on the surface of a silicon wafer having a copper thin film vapor deposited thereon to form a film of 15 μm thick. Heating for imidization was carried out in air as in Example 1. This polyimide film was peeled from the silicon wafer and content of copper in the film, color, heat decomposition temperature and tensile strength were measured. As a result, the film contained only 0.015% (atomic-absorption method) of copper and had brown color which was nearly the same as that of the film formed on an inert SiO₂ film. Furthermore, this film had markedly excellent heat resistance and mechanical properties, namely, a decomposition temperature of 500° C. in air, a tensile strength of 330 MPa, and an elongation of 19%.

As explained above, the present invention provides a method for producing a metal/polyimide composite article according to which oxidization deterioration of polyimide film which has been a problem when a polyamic acid is coated and cured on copper or silver can be prevented without necessity to carry out the curing in a reducing atmosphere or to use esterified polyamic acid difficult to prepare and imidized varnish having problem in solubility.

What is claimed is:

1. A process for producing a metal/polyimide composite article comprising:

providing a precursor of a polyimide in contact with copper or silver; and heating the precursor until it turns into the polyimide, wherein the precursor is a member selected from the groups consisting:

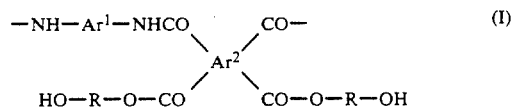

where Ar¹ is a residue of a diamine compound, Ar² is a residue of a tetracarboxylic acid, and R is a residue of an epoxy compound;

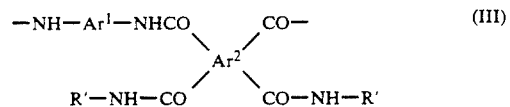

where Ar¹ and Ar² are defined above, the R' is a residue of a isocyanate compound; and

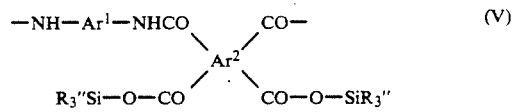

where Ar¹ and Ar² are defined above, and R" is a residue of a silyl compound.

2. The process for producing a metal/polyimide composite article according to claim 1, wherein the precursor is represented by the following general formula:

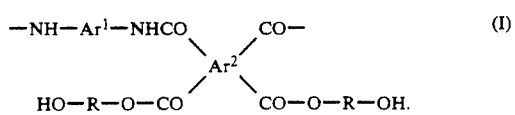

3. The process for producing a metal/polyimide composite article according to claim 1, wherein the precursor is represented by the following general formula:

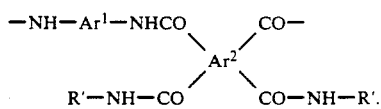
(III)

4. The process for producing a metal/polyimide composite article according to claim 1, wherein the precursor is represented by the following general formula:

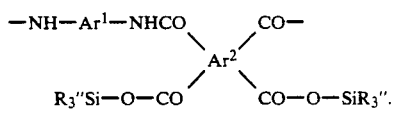
(V)

5. A process for producing a printed circuited board comprising:
   forming a copper film on an electrically insulating substrate;
   coating a precursor of a polyimide on said copper film; and
   heating the precursor until it turns into a polyimide, wherein the precursor is a member selected from the group consisting of:

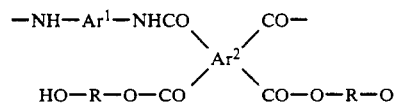
(I)

where $Ar^1$ is a residue of a diamine compound, $Ar^2$ is a residue of an tetracarboxylic acid, and R is a residue of an epoxy compound;

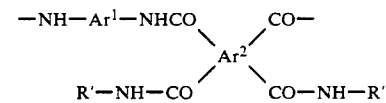
(III)

where $Ar^1$ and $Ar^2$ are defined above, and R' is a residue of a isocyanate compound; and

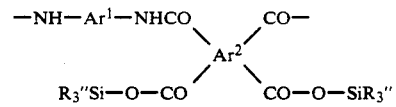
(V)

where $Ar^1$ and $Ar^2$ are defined above, and R" is a residue of a silyl compound.

6. The process for producing a printed circuit board according to claim 5, wherein the precursor is represented by the following general formula:

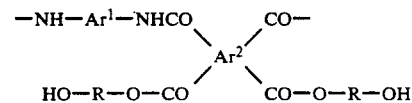
(II)

7. The process for producing a printed circuit board according to claim 5, wherein the precursor is represented by the following general formula:

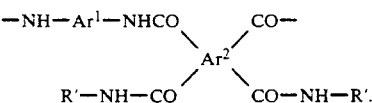
(III)

8. The process for producing a printed circuit board according to claim 5, wherein the precursor is following general formula:

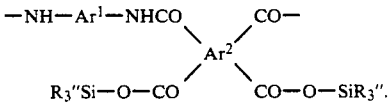
(V)

9. A process for producing a metal/polyimide composite article comprising:
   providing a homogeneous mixture of a precursor of a polyimide, powder of copper or silver, an organic solvent for dissolving the precursor; and
   heating the precursor until it turns into a polyimide, wherein the precursor is a member selected from a group consisting of:

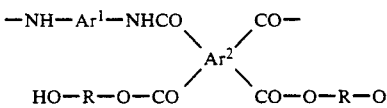
(I)

where $Ar^1$ is a residue of a diamine compound, $Ar^2$ is a residue of a tetracarboxylic acid, and R is a residue of a epoxy compound;

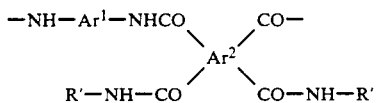
(III)

where $Ar^1$ and $Ar^2$ are defined above, and R' is a residue of a isocyanate compound; and

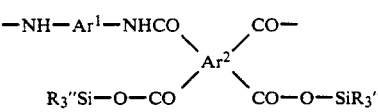
(V)

where $Ar^1$ and $Ar^2$ are defined above, and R" is a residue of a silyl compound.

10. The process for producing a metal/polyimide composite article according to claim 9, wherein the precursor is represented by the following general formula:

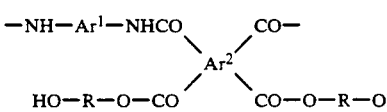
(II)

11. The process for producing a metal/polyimide composite article according to claim 9, wherein the precursor is represented by the following general formula:

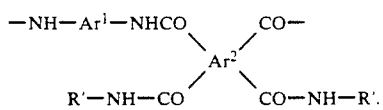 (III)

12. The process for producing a metal/polyimide composite article according to claim 9, wherein the precursor is represented by the following general formula:

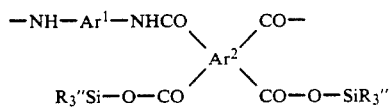 (V)

13. A process for producing multi-layered printed circuit board, which comprises the steps of:
- a first step for forming a circuit pattern of copper film on an electrically insulating substrate;
- a second step for coating varnish of a precursor of a polymide on said pattern;
- a third step for heating the varnish until the precursor turns into the polyimide;
- a fourth step for patterning the polyimide to form through-holes therein; and
- a fifth step for forming a circuit pattern of copper on said patterned polyimide;

said second step through said fifth step being repeated until a desired number of layers is obtained, wherein the precursor is a member selected from a group consisting of:

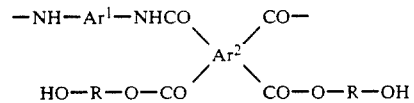 (I)

where $Ar^1$ is a residue of a diamine compound, $Ar^2$ is a residue of a tetracarboxylic acid, and R is a residue of an epoxy compound;

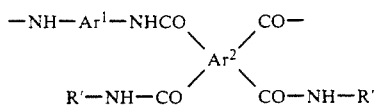 (III)

where $Ar^1$ and $Ar^2$ are defined above, and R' is a residue of an isocyanate compound; and

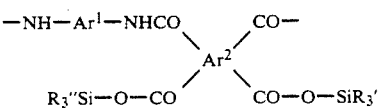 (V)

where $Ar^1$ and $Ar^2$ are defined above, and R" is a residue of a silyl compound.

14. The process for producing a multi-layered printed circuit board according to claim 13, wherein the precursor is represented by the following general formula:

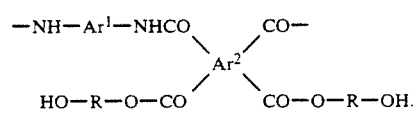 (II)

15. The process for producing a multi-layered printed circuit board according to claim 13, wherein the precursor is represented by the following general formula:

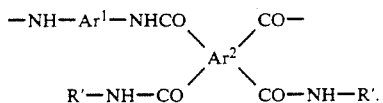 (III)

16. The process for producing a multi-layered printed circuit board according to claim 13, wherein the precursor is represented by the following general formula:

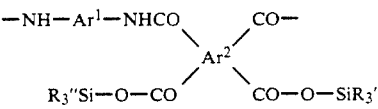 (V)

* * * * *